(12) United States Patent
Chen et al.

(10) Patent No.: US 8,169,043 B2
(45) Date of Patent: May 1, 2012

(54) OPTICAL SENEOR PACKAGE STRUCTURE AND MANUFACTUEING METHOD THEREOF

(75) Inventors: Yu-Hsiang Chen, Taipei (TW); Cheng-I Lu, Taipei (TW); Min-Nan Yeh, Taipei (TW); Chi-Hsiang Chang, Taipei (TW)

(73) Assignee: Cheng Uei Precision Industry Co., Ltd., New Taipei (TW)

( * ) Notice: Subject to any disclaimer, the term of this patent is extended or adjusted under 35 U.S.C. 154(b) by 243 days.

(21) Appl. No.: 12/702,317

(22) Filed: Feb. 9, 2010

(65) Prior Publication Data

US 2011/0175182 A1 Jul. 21, 2011

(30) Foreign Application Priority Data

Jan. 15, 2010 (TW) .............................. 99200919 U

(51) Int. Cl.
*H01L 31/0232* (2006.01)
(52) U.S. Cl. ........ 257/432; 257/433; 257/434; 257/684; 257/E31.127; 438/26; 438/28; 438/65; 438/125
(58) Field of Classification Search .................. 257/432
See application file for complete search history.

(56) References Cited

U.S. PATENT DOCUMENTS

| | | | | |
|---|---|---|---|---|
| 5,521,376 A * | 5/1996 | Mileski et al. | ................ | 250/239 |
| 6,147,389 A * | 11/2000 | Stern et al. | .................... | 257/434 |
| 6,184,544 B1 * | 2/2001 | Toda et al. | ....................... | 257/98 |
| 6,303,978 B1 * | 10/2001 | Daniels et al. | ................ | 257/642 |
| 6,628,193 B2 * | 9/2003 | Doi et al. | ...................... | 338/162 |
| 6,734,419 B1 * | 5/2004 | Glenn et al. | ................... | 250/239 |
| 6,956,245 B2 * | 10/2005 | Senda et al. | ..................... | 257/94 |
| 6,964,877 B2 * | 11/2005 | Chen et al. | ....................... | 438/20 |
| 7,227,236 B1 * | 6/2007 | Lee et al. | ....................... | 257/433 |
| 7,256,428 B2 * | 8/2007 | Braune et al. | ................. | 257/100 |
| 7,408,205 B2 * | 8/2008 | Webster et al. | ................. | 257/99 |
| 7,521,770 B2 * | 4/2009 | Wu et al. | ....................... | 257/432 |
| 7,554,599 B2 * | 6/2009 | Tu et al. | ......................... | 348/340 |
| 7,576,366 B2 * | 8/2009 | Shen | ................................. | 257/98 |
| 7,633,372 B2 * | 12/2009 | Araki et al. | ..................... | 338/160 |
| 7,664,390 B2 * | 2/2010 | Cho et al. | ....................... | 396/542 |
| 7,707,712 B2 * | 5/2010 | Kim | ................................. | 29/832 |
| 7,782,390 B2 * | 8/2010 | Lin | ................................. | 348/340 |
| 7,791,096 B2 * | 9/2010 | Craford et al. | ................... | 257/99 |
| 7,867,794 B2 * | 1/2011 | Kimura et al. | .................. | 438/27 |
| 7,892,869 B2 * | 2/2011 | Chuang et al. | .................. | 438/26 |
| 2003/0112364 A1 * | 6/2003 | Tanida et al. | .................. | 348/375 |
| 2003/0153108 A1 * | 8/2003 | Durocher et al. | .............. | 438/26 |
| 2004/0056971 A1 * | 3/2004 | Yang et al. | ..................... | 348/294 |

(Continued)

*Primary Examiner* — N Drew Richards
*Assistant Examiner* — Ankush Singal
(74) *Attorney, Agent, or Firm* — Lin & Associates IP, Inc.

(57) ABSTRACT

An optical sensor package structure includes a substrate, a metal plate, an optical sensing chip, a plurality of bonding wires and a lens module. The substrate includes a top surface, a bottom surface and a hole penetrating the top surface and the bottom surface. The metal plate covers the hole from the bottom surface of the substrate. The optical sensing chip is received in the hole and mounted on the metal plate. The bonding wires interconnect the optical sensing chip and the top surface of substrate. The lens module is covering on the hole and mounting on the top surface of the substrate to enclose the optical sensing chip and the bonding wires. Because the optical sensing chip is received in the hole of the substrate, the height of the optical sensor package structure can be reduced to adapt to a compact size electrical device.

4 Claims, 4 Drawing Sheets

U.S. PATENT DOCUMENTS

| | | | |
|---|---|---|---|
| 2004/0189862 A1* | 9/2004 | Gustavsson et al. | 348/376 |
| 2004/0212719 A1* | 10/2004 | Ikeda | 348/340 |
| 2004/0251510 A1* | 12/2004 | You et al. | 257/433 |
| 2005/0139848 A1* | 6/2005 | Yee | 257/98 |
| 2005/0230772 A1* | 10/2005 | Vittu | 257/432 |
| 2005/0236699 A1* | 10/2005 | Chapman | 257/666 |
| 2005/0258502 A1* | 11/2005 | Kong et al. | 257/433 |
| 2006/0016973 A1* | 1/2006 | Yang et al. | 250/239 |
| 2006/0093352 A1* | 5/2006 | Webster et al. | 396/529 |
| 2006/0145325 A1* | 7/2006 | Yang et al. | 257/680 |
| 2007/0001286 A1* | 1/2007 | Chiu et al. | 257/700 |
| 2007/0108577 A1* | 5/2007 | Tu et al. | 257/680 |
| 2007/0165131 A1* | 7/2007 | Ish-Shalom et al. | 348/345 |
| 2007/0228558 A1* | 10/2007 | Brechignac et al. | 257/734 |
| 2007/0241273 A1* | 10/2007 | Kim et al. | 250/239 |
| 2008/0083980 A1* | 4/2008 | Yang et al. | 257/700 |
| 2008/0191335 A1* | 8/2008 | Yang et al. | 257/680 |
| 2008/0278617 A1* | 11/2008 | Tanida et al. | 348/340 |
| 2009/0033789 A1* | 2/2009 | Lin | 348/374 |
| 2009/0160998 A1* | 6/2009 | Fukamachi et al. | 348/340 |
| 2009/0184385 A1* | 7/2009 | Vittu | 257/432 |
| 2011/0079811 A1* | 4/2011 | Lin et al. | 257/98 |

* cited by examiner

OPTICAL SENEOR PACKAGE STRUCTURE AND MANUFACTUEING METHOD THEREOF

BACKGROUND OF THE INVENTION

1. Field of the Invention

The invention relates to a chip package structure, and more particularly to an optical sensor package structure and manufacturing method of the optical sensor package structure.

2. The Related Art

Please refer to FIG. 5. A conventional optical sensor device 80 is an image sensor device such as a CCD camera and a CMOS camera, which includes a lens module 81, an image sensor 82 and a printed circuit board 83. The image sensor 82 is mounted on the printed circuit board 83. The lens module 81 is mounted on the printed circuit board 83 and covers the image sensor 82. A plurality of bonding wires 84 is interconnected with the image sensor 82 and the printed circuit board 83 for communicating electrical signal.

However, because the printed circuit board 83, the image sensor 82 and the lens module 81 are stacked in order from the bottom to the top, the height of the optical sensor device 80 is increased. Hence, the optical sensor device can hardly be configured into a compact electrical device, such as a mobile phone, a PDA, a MP3 player, a MP4 player, a notebook computer, etc.

SUMMARY OF THE INVENTION

An object of the present invention is to provide an optical sensor package structure with a compact size.

According to the prevent invention, the optical sensor package structure includes a substrate, a metal plate, an optical sensing chip, a plurality of bonding wires and a lens module. The substrate includes a top surface, a bottom surface and a hole penetrating the top surface and the bottom surface. The metal plate covers the hole from the bottom surface of the substrate.

The optical sensing chip is received in the hole and mounted on the metal plate. The bonding wires interconnect the optical sensing chip and the top surface of substrate. The lens module is covering on the hole and mounting on the top surface of the substrate to enclose the optical sensing chip and the bonding wires.

An object of the present invention is to provide a method of manufacturing the optical sensor package structure.

According to the prevent invention, the method includes:
Step 1: forming the hole penetrating the substrate from the top surface to the bottom surface of the substrate;
Step 2: covering the metal plate on the hole and adhering the metal plate to the bottom surface of the substrate;
Step 3: positioning the optical sensing chip in the hole and adhering a mounting surface of the optical sensing chip to the metal plate;
Step 4: bonding the wires between the optical sensing chip and the top surface of the substrate;
Step 5: adhering a supporting frame with an infrared filter to a sensing surface of the optical sensing chip; and
Step 6: covering the lens module on the hole to enclose the optical sensing chip, the supporting frame and the infrared filter.

As describe above, the metal plate can shield the optical sensing chip to prevent the optical sensing chip from electromagnetic disturbance. The metal plate also can disperse thermal energy produced from the optical sensing chip to prevent the optical sensing chip from fault operation. Because the optical sensing chip, the supporting frame and the infrared filter are received in the hole of the substrate, the height of the optical sensor package structure can be reduced to adapt to a compact size electrical device.

BRIEF DESCRIPTION OF THE DRAWINGS

The present invention will be apparent to those skilled in the art by reading the following description thereof, with reference to the attached drawings, in which.

DETAILED DESCRIPTION OF THE PREFERRED EMBODIMENT

Figure 1:
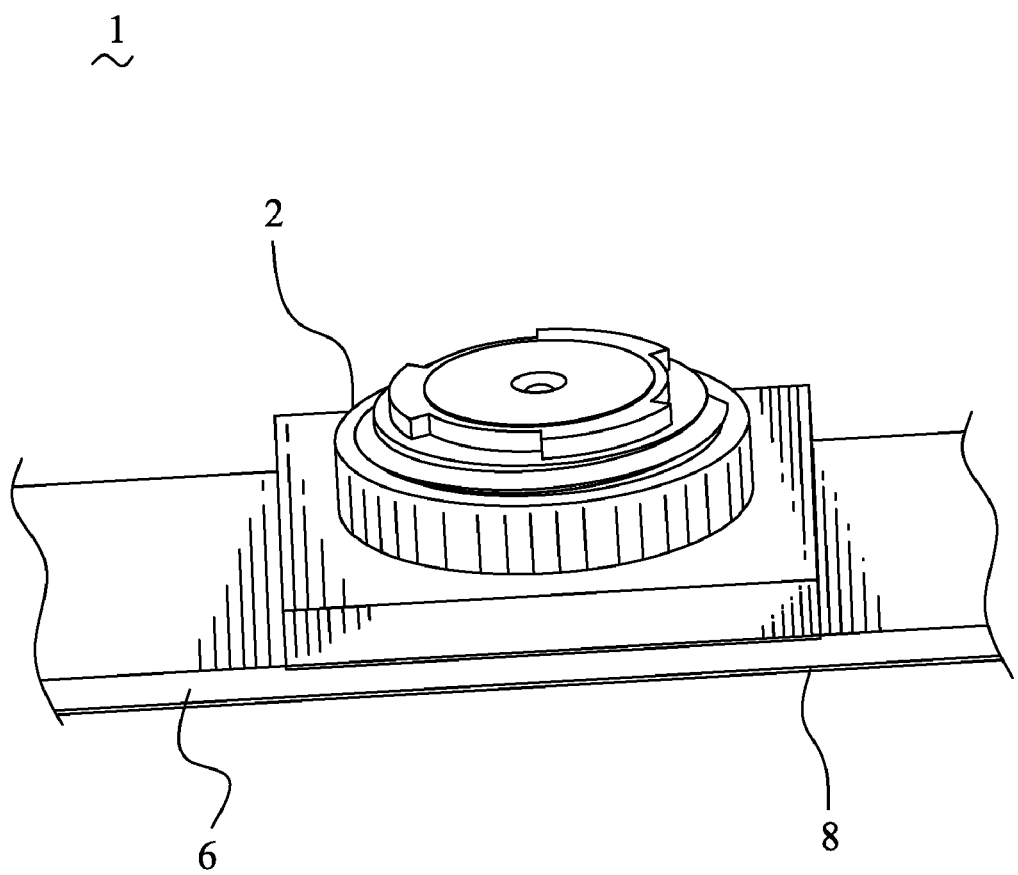
FIG. 1 is a perspective view of an optical sensor package structure according to the present invention.
Figure 2:
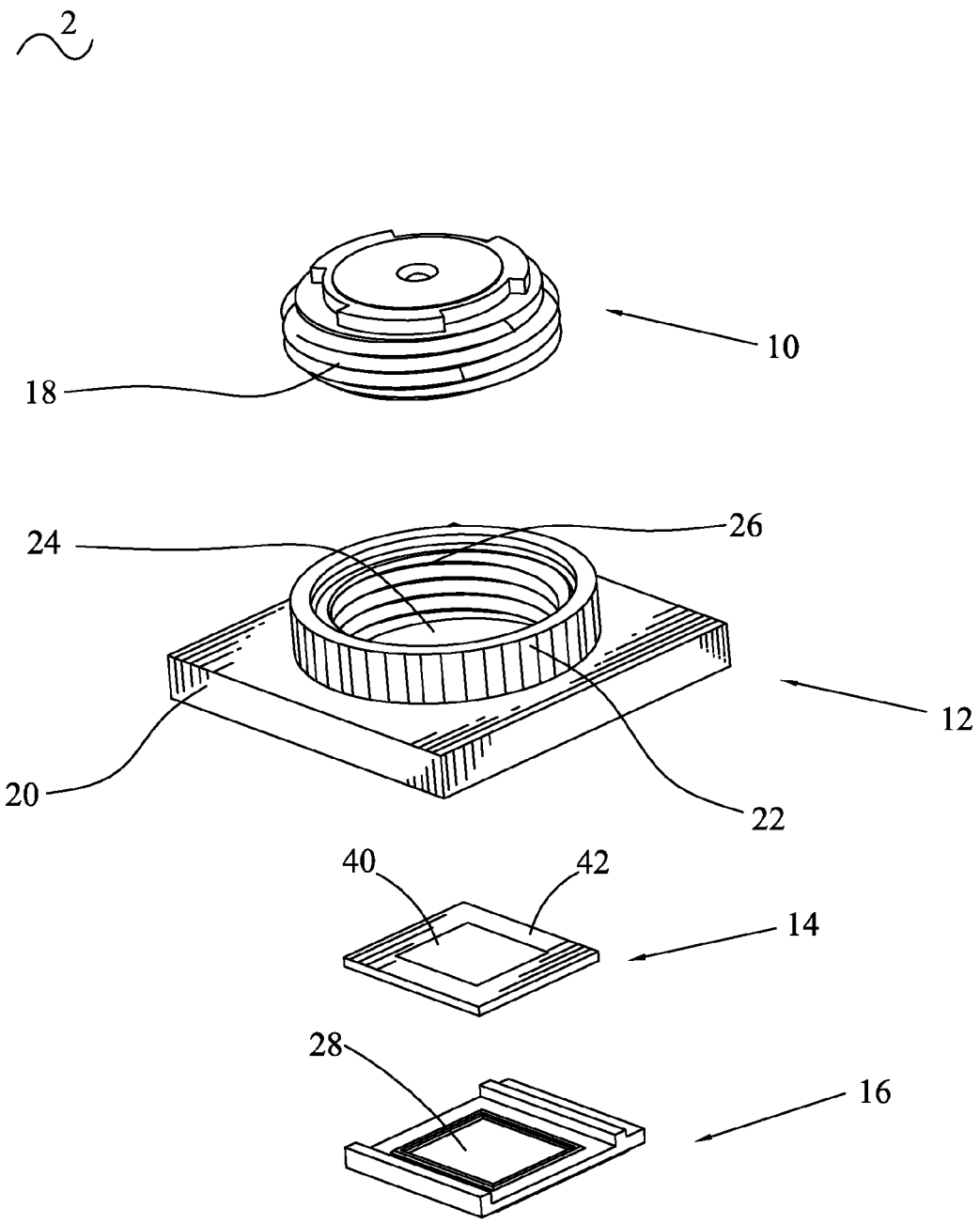
FIG. 2 is an exploded view of the optical sensor package structure in FIG. 1.
Figure 3:
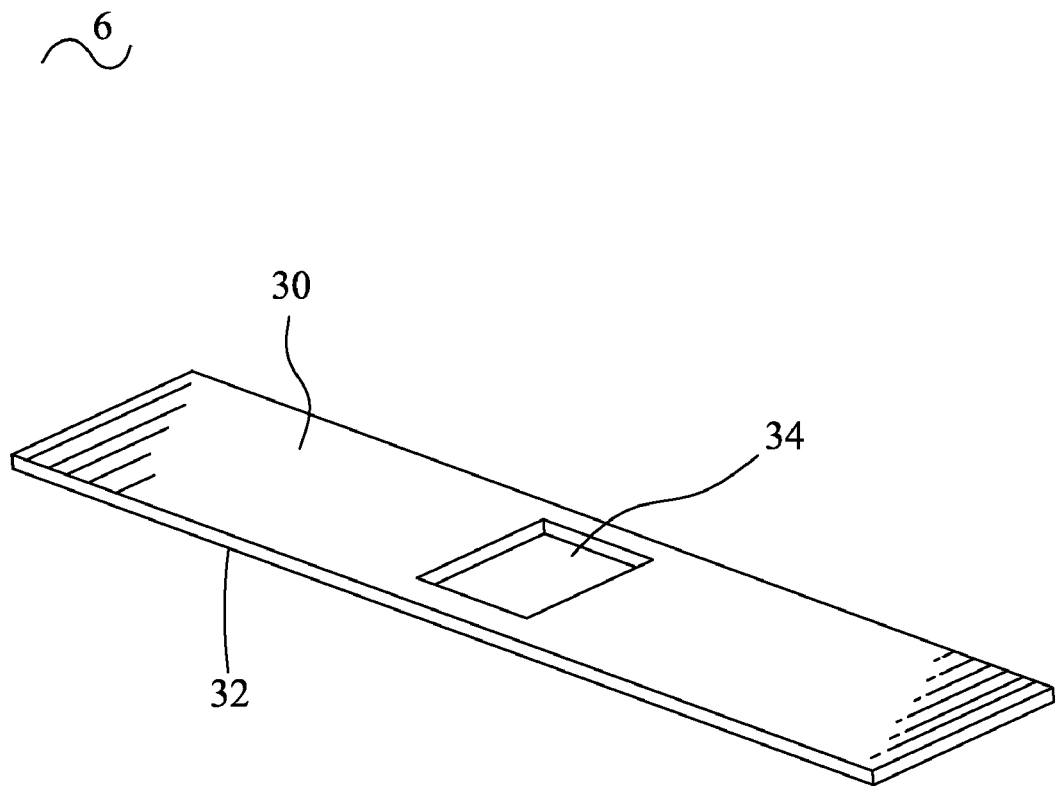
FIG. 3 is a perspective view of a printed circuit board of the optical sensor package structure in FIG. 1.
Figure 4:
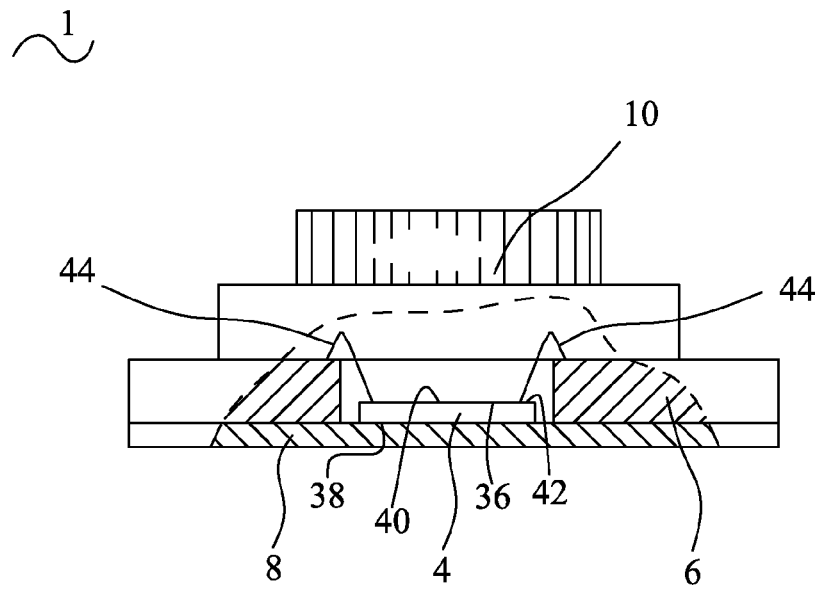
FIG. 4 is a cross section view of the optical sensor package structure in FIG. 1.
Figure 5:
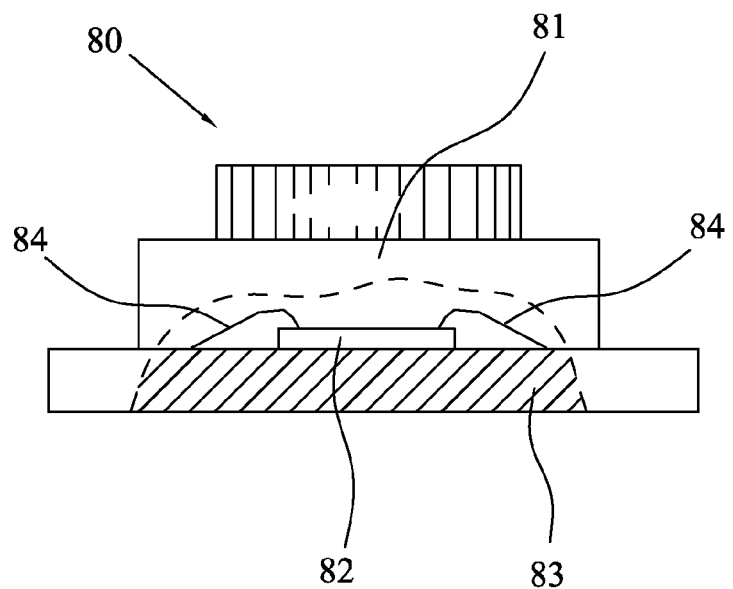
FIG. 5 is a perspective view of a conventional optical sensor device.

Please refer to FIG. 1 to FIG. 4. A preferred embodiment of an optical sensor package structure 1 includes a lens module 2, an optical sensing chip 4, a substrate 6 and a metal plate 8. The lens module 2 includes a lens 10, a lens socket 12, an infrared filter 14 and a supporting frame 16 arranged in order from the top to the bottom.

The lens 10 defines a first thread 18 at a lateral surface thereof. The lens socket 12 includes a rectangular base 20, a cylinder 22 protruding from a top surface of the rectangular 20 and a receiving space 24 forming in the cylinder 22 and vertically penetrating a top of the cylinder 22 and a bottom of the rectangular base 20. The cylinder 22 is formed with a second thread 26 at an inner lateral surface of the cylinder 22. The lens socket 10 is engaged into the receiving space 24 of the lens socket 12 by engaging the first thread 18 and the second thread 26.

The supporting frame 16 defines a first hole 28 penetrating a middle thereof. The infrared filter 14 covers on the first hole 28 and is supported by the supporting frame 16. The substrate 6 includes a top surface 30, a bottom surface 32 opposite to the top surface 30 and a second hole 34 penetrating the top surface 30 and the bottom surface 32. Especially, each of the first hole 28 and the second hole 34 is of a rectangular shape. The substrate 6 can be a printed circuit board.

By manufacturing the optical sensor package structure 1, the metal plate 8 is adhered to the bottom surface 32 of the substrate 6 via a conductive adhesive capable of electric conduction (not shown in figures). The optical sensing chip 4 is received in the second hole 34 and mounting on the metal plate 8. Especially, the sensing chip 4 includes a sensing surface 36 and a mounting surface 38 opposite to the sensing surface 26. The mounting surface 38 of the optical sensing chip 4 is adhered to the metal plate 8 via a thermal adhesive. Hence, the sensing surface 36 of the optical sensing chip 4 is arranged to face upwardly. The thermal adhesive is a non-conductive adhesive.

The sensing surface 36 includes a middle sensing section 40 and a periphery connecting section 42. The periphery connecting section 42 is electronically connected to the substrate 6 via a plurality of bonding wires 44. The supporting frame 16 with the infrared filter 14 is mounting on the sensing surface 36 of the optical sensing chip 4. The supporting frame 16 is adhered on the sensing surface 36 via the thermal adhesive. The sensing section 40 of the optical sensing ship 4 is aligned with the first opening 28 of the supporting frame 16 for being exposed through the first opening 28.

The lens socket 12 with the lens 10 is mounting on the top surface 30 of the printed circuit board 6 and covers on the second hole 34 for enclosing the optical sensing chip 4, the supporting frame 16 and the infrared filter 14. The receiving space 24, the first hole 28 of the supporting frame 16 and the sensing section 40 of the optical sensing chip 4 are aligned with each other along a vertical direction. Hence, a light beam emitted from outside can pass through the lens 10, the receiving space 24, the infrared filter 14, the first hole 28 of the supporting frame 16, the second hole 34 of the substrate 6 in order and be received by the sensing section 40 of the optical sensing ship 4.

The light beam is transferred into an electrical signal by the optical sensing ship 4. The electrical signal is sent to the substrate 6 via the periphery section 42 of the optical sensing chip 4 and the bonding wires 44.

As describe above, the metal plate 8 can shield the optical sensing chip 4 to prevent the optical sensing chip 4 from electromagnetic interference. The metal plate 8 also can disperse thermal energy produced from the optical sensing chip 4 to prevent the optical sensing chip 4 from fault operation. Because the optical sensing chip 4, the supporting frame 16 and the infrared filter 14 are received in the second hole 34 of the substrate 6, the height of the optical sensor package structure 1 is reduced to adapt to be configured in a compact size electrical device.

Furthermore, the present invention is not limited to the embodiment described above; various additions, alterations and the like may be made within the scope of the present invention by a person skilled in the art. For example, respective embodiments may be appropriately combined.

What is claimed is:

1. An optical sensor package structure, comprising:
    a substrate comprising a top surface, a bottom surface and a first hole penetrating the top surface and the bottom surface;
    a metal plate covering the first hole from the bottom surface of the substrate;
    an optical sensing chip received in the first hole and mounted on the metal plate, the optical sensing chip having a supporting surface mounted on the metal plate, a sensing surface, a sensing section formed at a middle of the sensing surface and a connecting section formed at a periphery of the sensing surface;
    a plurality of bonding wires interconnected between the optical sensing chip and the top surface of the substrate, the connecting section of the optical sensing chip being connected to the bonding wires; and
    a lens module covering on the first hole and mounted on the top surface of the substrate to enclose the optical sensing chip and the bonding wires, the lens module having a supporting frame mounted on the optical sensing chip, an infrared filter mounted on the supporting frame, a lens socket with a lens covering on the first hole and enclosing the optical sensing chip, the supporting frame and the infrared filter, and the supporting frame having a second hole penetrating a middle thereof and aligned with the sensing section;
    wherein the supporting frame with the infrared filter is received in the first hole, the sensing surface faces the infrared filter, and the infrared filter covers upon the second hole of the supporting frame.

2. The optical sensor package structure as claimed in claim 1, wherein the lens socket comprises a base, a cylinder protruding from a top of the base and a receiving space penetrating the lens socket from a top of the cylinder to a bottom of the base, and the receiving space is aligned with the second hole of the supporting frame and the sensing section of the optical sensing chip, and receives the lens therein.

3. The optical sensor package structure as claimed in claim 2, wherein the lens comprises a first thread formed at an outer lateral surface, and the lens socket comprises a second thread formed at in inner lateral surface of the cylinder for engaging with the first thread of the lens.

4. A method of manufacturing an optical sensor package structure, comprising:
    forming a first hole penetrating a substrate from a top surface to a bottom surface of the substrate;
    covering a metal plate on the first hole and adhering the metal plate to the bottom surface of the substrate;
    positioning an optical sensing chip in the first hole and adhering a mounting surface of the optical sensing chip to the metal plate;
    bonding a plurality of wires between the optical sensing chip and the top surface of the substrate;
    adhering a supporting frame with an infrared filter to a sensing surface of the optical sensing chip; and
    covering a lens module on the first hole to enclose the optical sensing chip, the supporting frame and the infrared filter.

* * * * *